(12) United States Patent
Deutsch et al.

(10) Patent No.: US 11,594,863 B2
(45) Date of Patent: Feb. 28, 2023

(54) SMILE CORRECTION USING FAC LENS DEFORMATION

(71) Applicant: Teradiode, Inc., Wilmington, MA (US)

(72) Inventors: Michael Deutsch, Derry, NH (US); Daqing Wang, Westford, MA (US)

(73) Assignee: TERADIODE, INC., Wilmington, MA (US)

( * ) Notice: Subject to any disclaimer, the term of this patent is extended or adjusted under 35 U.S.C. 154(b) by 409 days.

(21) Appl. No.: 16/817,884

(22) Filed: Mar. 13, 2020

(65) Prior Publication Data

US 2020/0285049 A1 Sep. 10, 2020

Related U.S. Application Data

(63) Continuation of application No. 14/476,544, filed on Sep. 3, 2014, now Pat. No. 10,627,618.

(60) Provisional application No. 61/872,876, filed on Sep. 3, 2013.

(51) Int. Cl.
| | |
|---|---|
| *G02B 27/54* | (2006.01) |
| *H01S 5/40* | (2006.01) |
| *H01S 5/00* | (2006.01) |
| *G02B 27/00* | (2006.01) |
| *G02B 27/30* | (2006.01) |

(52) U.S. Cl.
CPC ........ *H01S 5/4031* (2013.01); *G02B 27/0025* (2013.01); *G02B 27/54* (2013.01); *H01S 5/005* (2013.01); *G02B 27/0068* (2013.01); *G02B 27/0075* (2013.01); *G02B 27/0081* (2013.01); *G02B 27/30* (2013.01); *H01S 5/0014* (2013.01)

(58) Field of Classification Search
None
See application file for complete search history.

(56) References Cited

U.S. PATENT DOCUMENTS

| | | | |
|---|---|---|---|
| 6,166,759 A | 12/2000 | Blanding | |
| 7,070,107 B2 * | 7/2006 | Tsikos | G02B 26/105 235/462.14 |
| 2002/0080464 A1 | 6/2002 | Bruns | |
| 2006/0114572 A1 * | 6/2006 | Bittner | G02B 27/30 359/641 |
| 2008/0314499 A1 * | 12/2008 | Begon | B29C 63/0073 156/367 |
| 2009/0168414 A1 | 7/2009 | Bailey | |
| 2012/0320587 A1 | 12/2012 | Roberts et al. | |

(Continued)

FOREIGN PATENT DOCUMENTS

| | | |
|---|---|---|
| CN | 102468407 | 5/2012 |
| WO | 2008128509 | 10/2008 |

OTHER PUBLICATIONS

International Search Report and Written Opinion dated Mar. 10, 2015 for International Application No. PCT/US14/53937 (13 pages).

*Primary Examiner* — Christopher Stanford
*Assistant Examiner* — Journey F Sumlar
(74) *Attorney, Agent, or Firm* — Morgan, Lewis & Bockius LLP

(57) ABSTRACT

A system and method of providing a deformed FAC Lens to a multi-emitter diode bar laser system comprised of a lens holder and FAC lens wherein the FAC Lens is deformed so as to offset or compensate for the inherent smile properties present in a multi-emitter diode bar.

20 Claims, 14 Drawing Sheets

(56) References Cited

U.S. PATENT DOCUMENTS

2013/0258469 A1 10/2013 Park et al.
2015/0062891 A1 3/2015 Deutsch et al.

* cited by examiner

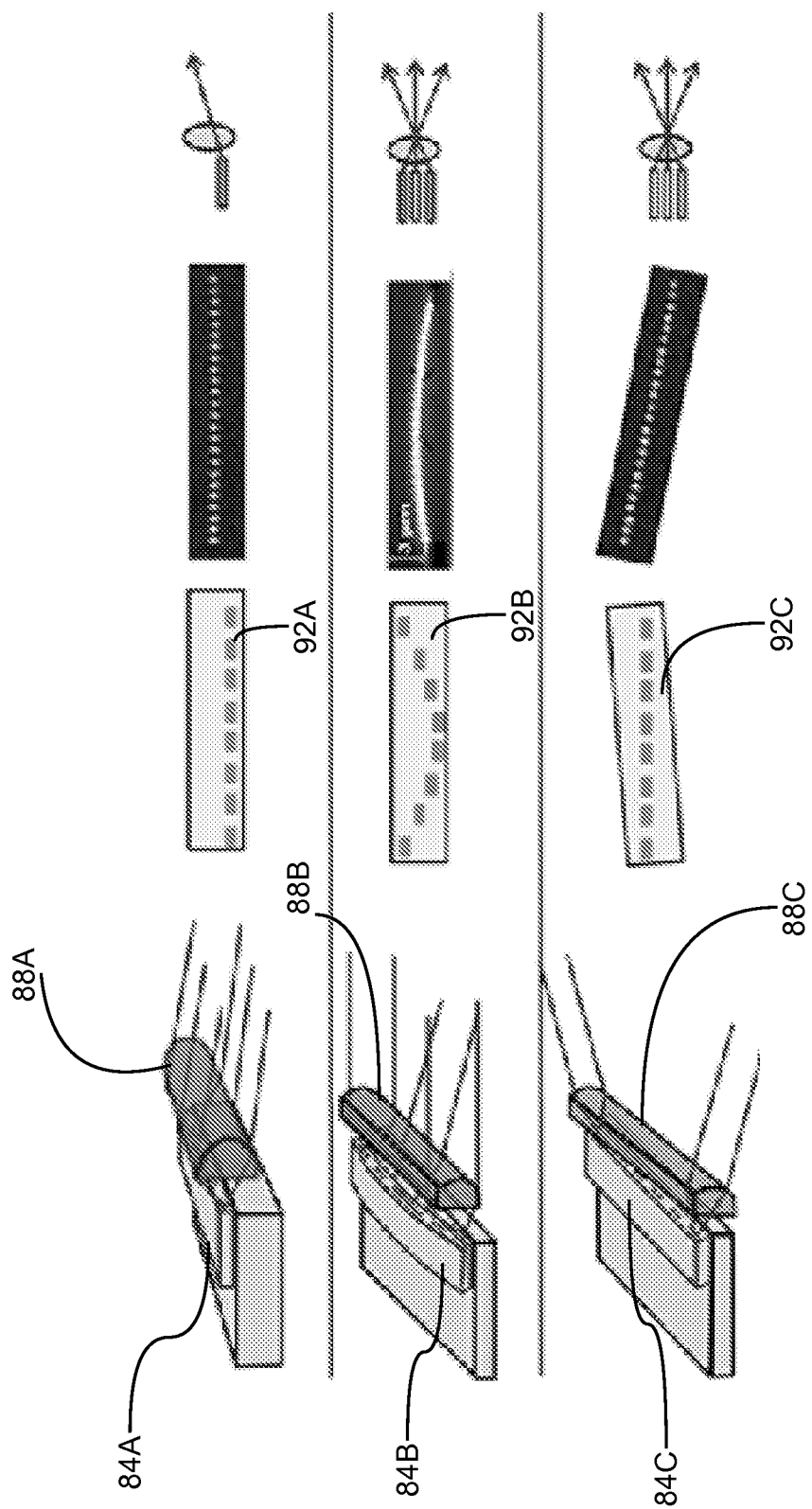

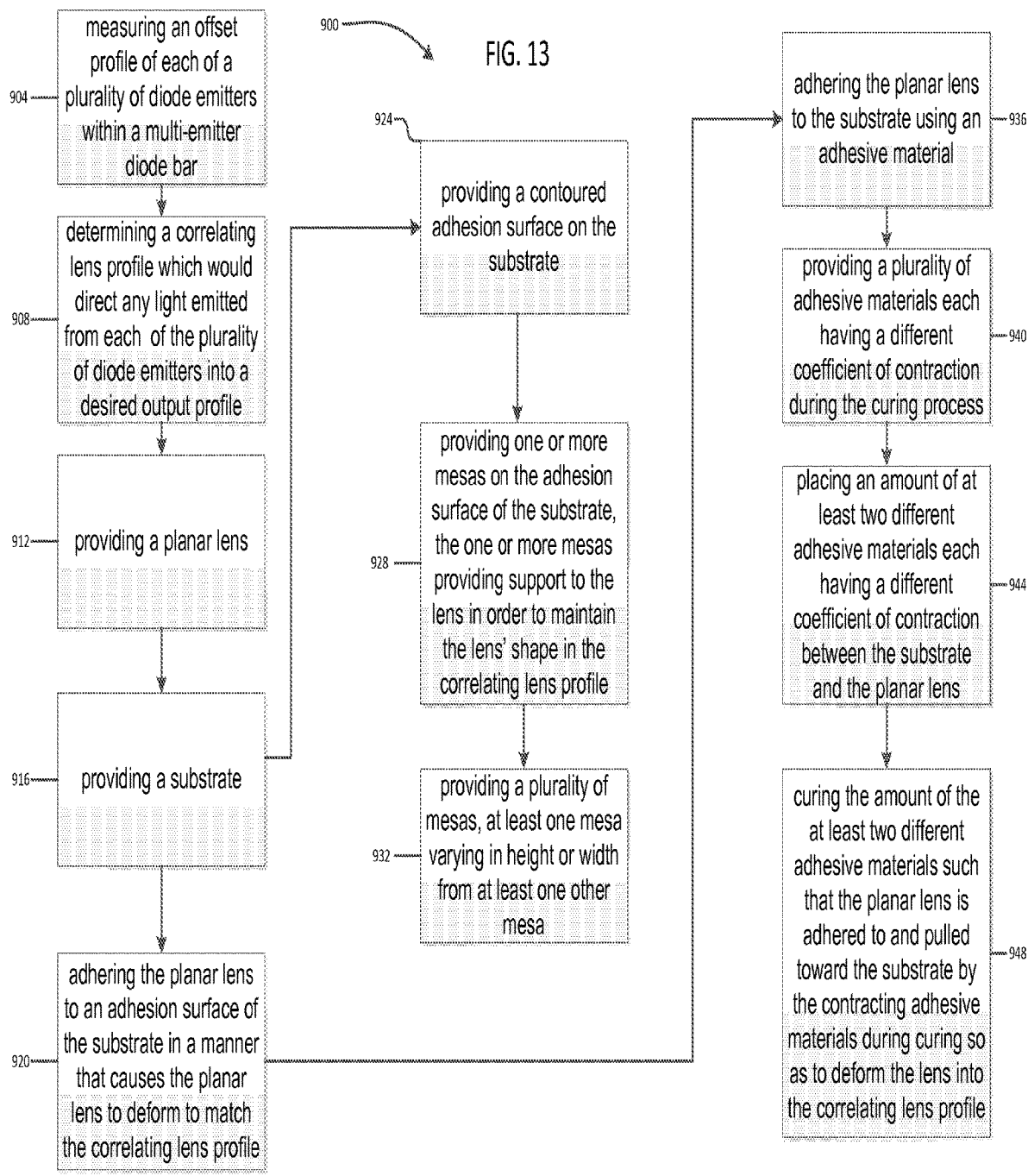

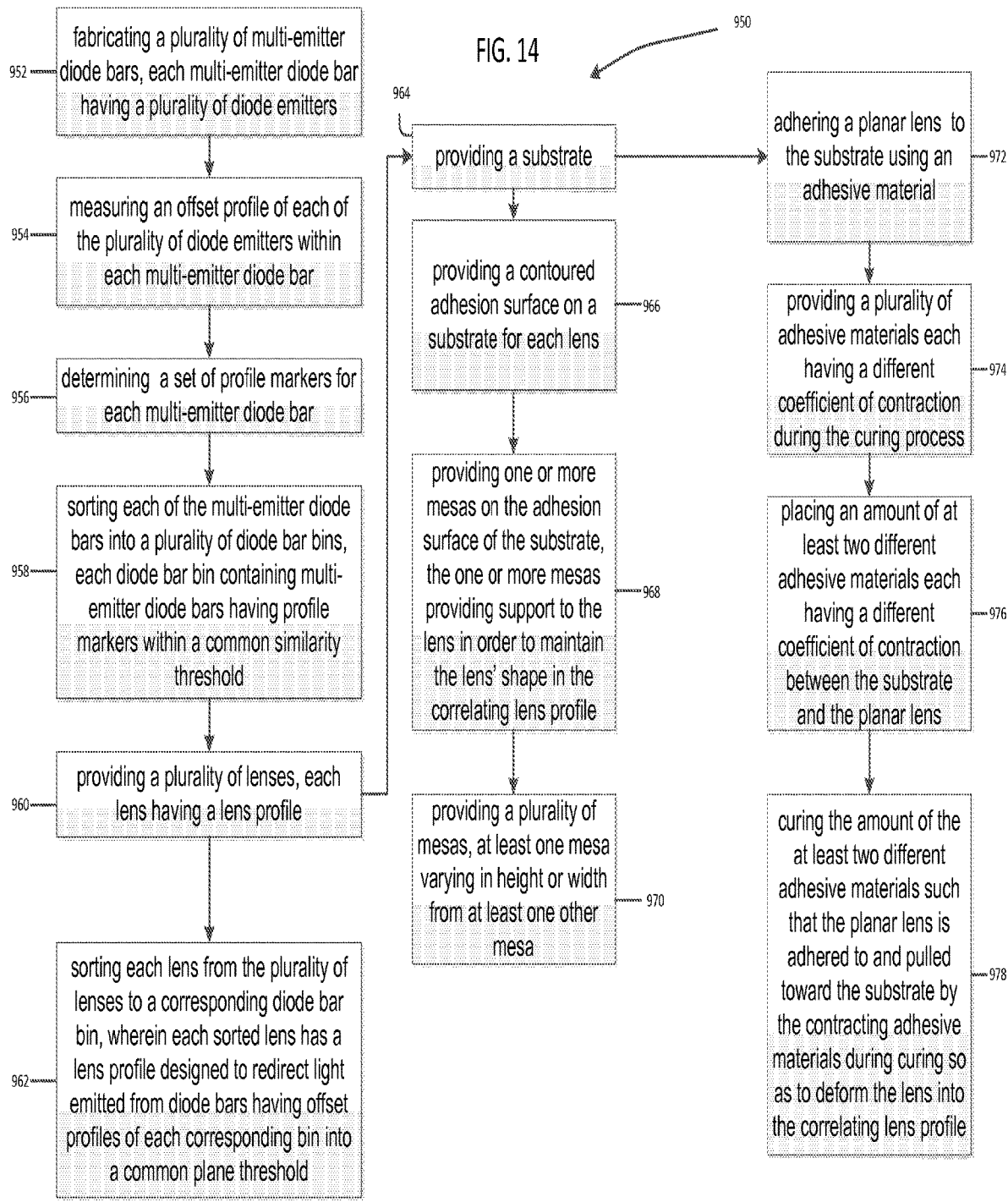

SMILE CORRECTION USING FAC LENS DEFORMATION

PRIORITY INFORMATION

This application is a continuation of U.S. patent application Ser. No. 14/476,544, filed Sep. 3, 2014, which claims the benefit of and priority to U.S. Provisional Patent Application No. 61/872,876, filed Sep. 3, 2013, the entire disclosure of each of which is hereby incorporated herein by reference.

COPYRIGHT INFORMATION

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present embodiments relate generally to correcting the offsetting of emitters, which is commonly referred to in the art as 'smile', in a multi-emitter light emitting diode laser system, and particularly in systems containing diode bar lasers.

2. Description of the Prior Art

Diode bars and other fixed-position emitting devices which produce multiple emission outputs often have a tendency to have a certain degree of 'smile', or output beams forming a 'smile' shaped curvature, when the diode bar is mounted to a system. It will be appreciated that such smile can result from various factors, including some of the following: the stress from mounting the lens, or the manufacturing process of placing multiple emitters side-by-side might be imprecise to a certain degree. Alternatively, external stresses or strains from heat or machining can also introduce deflections that result in smile. It will be appreciated that smile is a common problem and that numerous causes exist and that the above list is not exhaustive. The term 'smile' refers to a deflection of a diode bar, an out-of-plane emission from individual emitters, or additionally any non-normal emission of light from each of the individual emitters within a particular diode bar. Such deflection or out-of-plane emission can exist in more complex shapes and curvatures of the diode bar than a mere upward curvature of the ends of the diode bar. Such emission shapes can include frown like shapes, or other higher degree of order shapes having numerous respective peaks or respective valleys arranged in any orientation and with any respective spacing. Alternatively the degree of deflection may vary over the length of a diode bar resulting in different radii of curvature at various points. Sometimes smile is referred to as pointing errors.

It will also be appreciated that such smile can reduce the efficiency of, or increase the rate of degradation of, a wavelength beam combining (WBC) system and can result in the need for more complex, bulky, or expensive optics to be used in order to correct for the smile.

Correcting smile is an ongoing endeavor, and the present systems and methodologies described herein seek to offer solutions for correcting for smile which overcome many of the deficiencies of the present state of the art. Such deficiencies include easing the difficulties in manufacturing and reducing the cost of smile correcting lenses.

SUMMARY OF THE INVENTION

The present invention includes various apparatuses and methods in various arrangements. One such embodiment includes a method of reducing the beam quality degradation of a multi-emitter diode bar within a light emitting diode laser system, the method including the steps of: profiling an offset profile of each of a plurality of diode emitters within a multi-emitter diode bar; determining a correlating lens profile which would direct any light emitted from each of the plurality of diode emitters into a common plane threshold; providing a planar lens, i.e. a fast-axis collimating (FAC) lens; providing a substrate; and adhering the planar lens to an adhesion surface of the substrate in a manner that causes the planar lens to deform to match the correlating lens profile.

The above method may further include the following steps, elements, or arrangements, in any order and in any combination: adhering the planar lens to the substrate using an epoxy material; providing a plurality of epoxy materials each having a different coefficient of contraction during the curing process; placing an amount of at least two different epoxy materials each having a different coefficient of contraction between the substrate and the planar lens, and curing the amount of the at least two different epoxy materials such that the planar lens is adhered to and pulled toward the substrate by the contracting epoxies during curing so as to deform the lens into the correlating lens profile; providing a contoured adhesion surface on the substrate; providing one or more mesas on the adhesion surface of the substrate, the one or more mesas providing support to the lens in order to maintain the lens' shape in the correlating lens profile; providing a plurality of mesas, at least one mesa varying in height or width from at least one other mesa.

Also contemplated within the scope of the present invention is a method of reducing the beam quality degradation of a multi-emitter diode bar, the method including the steps of: fabricating a plurality of multi-emitter diode bars, each multi-emitter diode bar having a plurality of diode emitters; measuring an offset profile of each of the plurality of diode emitters within each multi-emitter diode bar; determining a set of profile markers for each multi-emitter diode bar; sorting each of the multi-emitter diode bars into a plurality of diode bar bins, each diode bar bin containing multi-emitter diode bars having profile markers within a common similarity threshold; providing a plurality of lenses, each lens having a lens profile; and pairing each lens from the plurality of lenses to a corresponding diode bar bin, wherein each paired lens has a lens profile designed to redirect light emitted from diode bars having offset profiles of each corresponding bin into a common plane threshold.

The above method may further include the following steps, elements, or arrangements, in any order and in any combination. Forming each of the plurality of lenses, the forming comprising: providing a plurality of epoxy materials each having a different coefficient of contraction during the curing process; placing an amount of at least two different epoxy materials each having a different coefficient of contraction between the substrate and a planar lens; and curing the amount of the at least two different epoxy materials such that the planar lens is adhered to and pulled toward the substrate by the contracting epoxies during curing so as to deform the lens into the correlating lens profile.

The above process can further include the following steps, elements or arrangements, in any order and in any combination, including forming each of the plurality of lenses using a forming step. The forming step of each lens comprising: providing a contoured adhesion surface on a substrate for each lens; providing the contoured adhesion surface on the substrate for each lens includes providing one or more mesas, the one or more mesas providing support to the lens in order to maintain the lens' shape in a correlating lens profile; adhering each lens to a corresponding substrate using an epoxy material and thus deforming the lens by a curing process of the epoxy, and providing a plurality of epoxy materials wherein each epoxy material can have a different coefficient of contraction during the curing process The above process can further include the following steps, elements or arrangements, in any order and in any combination, including placing an amount of at least two different epoxy materials each having a different coefficient of contraction between each lens and each corresponding substrate; and curing the amount of the at least two different epoxy materials such that each lens is adhered to and pulled toward its corresponding substrate by the contracting epoxies during curing so as to deform the lens into the correlating lens profile, wherein the contoured adhesion surface can include a plurality of mesas, at least one mesa varying in height or width from at least one other mesa.

Further contemplated in the present invention is an apparatus, wherein the apparatus includes a diode laser assembly has various components, such components including the following: a multi-emitter diode bar having a longitudinal axis, wherein an array of emitters are placed along the longitudinal axis proximal the longitudinal axis, wherein the multi-emitter diode bar has an offset profile which describes how far each emitter is located or emits from the longitudinal axis; a deformed lens, i.e. an FAC lens, the lens having a correlating lens profile shape configured to receive light emitted from the array of emitters and shaped so as to correct the offset profile thus capturing the light into a desired profile, (such as configuring each of the emitted beams to be parallel or non-parallel with each other); and a substrate having a contoured adhesion surface abutting the deformed lens and being configured to maintain the shape of the deformed lens.

The above apparatus can further include any of the following elements or arrangements, in any order and in any combination. One or more mesas can be provided on the contoured adhesion surface, the one or more mesas providing support to the lens in order to maintain the lens in the correlating lens shape; one or more epoxy materials used to adhere the deformed lens to the contoured adhesion surface of the substrate. When at least two epoxy materials are used to adhere the deformed lens to the contoured adhesion surface of the substrate, at least one epoxy material can be provided having a different coefficient of retraction than at least one other epoxy material. Further, when one or more mesas are provided on the contoured adhesion surface, the one or more mesas providing support to the lens can be provided at varying heights and thicknesses.

BRIEF DESCRIPTION OF THE DRAWINGS

FIG. 2 illustrates various multi-emitter diode bars with exemplary smile profiles;

FIG. 13 illustrates a flow chart depicting a method of fabricating fast-axis collimating lenses for use in laser systems as exemplified in FIGS. 1-A-B; and FIG. 14 wherein different lens deformation configurations can achieved by adhering the lens using an adhesive material to deform the using a singular adhesive material on a planar surface of a substrate, wherein the adhesive material is subjected to a curing accelerant having a varying intensity across the surface of the substrate and the lens, the varying contour configurations illustrates a flow chart depicting another binning fabrication method of fabricating fast-axis collimating lenses for use in laser systems as exemplified in FIGS. 1-A in accordance with another aspect of the present invention.

DETAILED DESCRIPTION OF THE PREFERRED EMBODIMENT

Figure 1A:
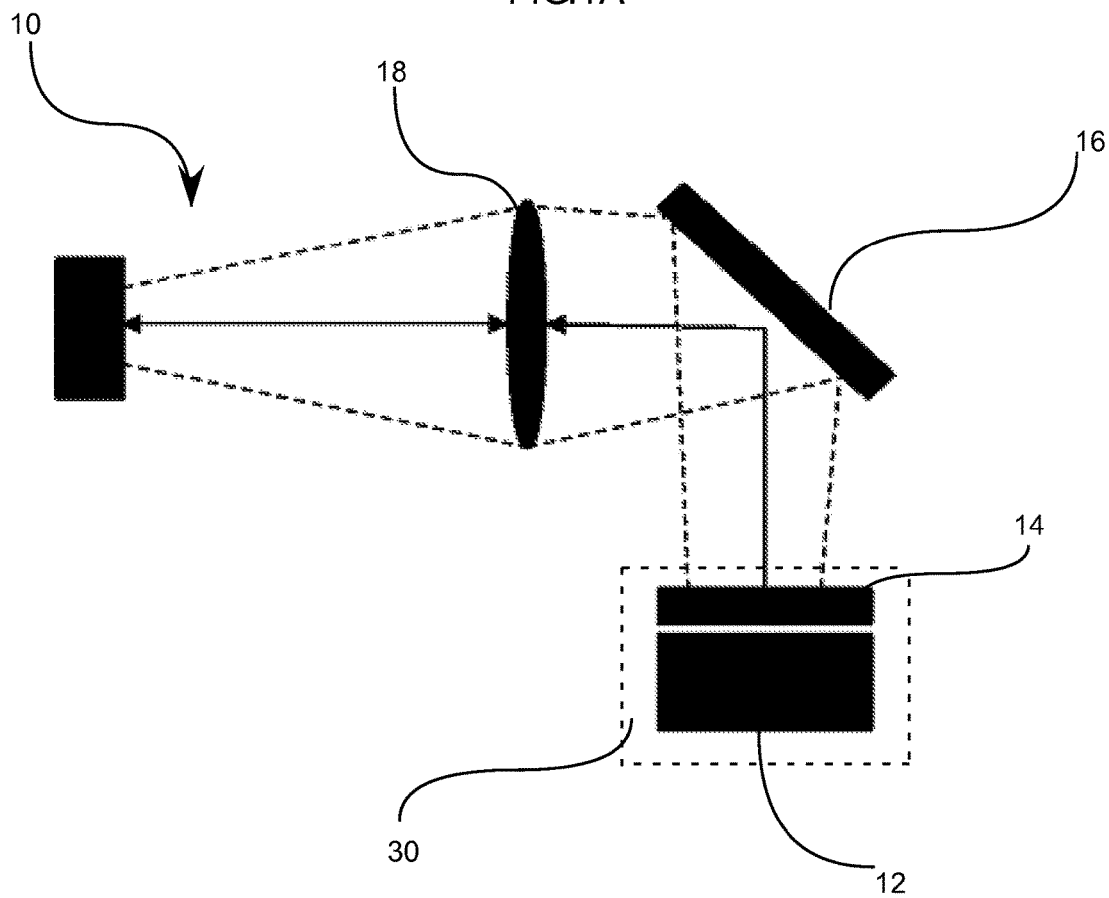
FIGS. 1A-B illustrate exemplary light emitting diode laser systems having multi-emitter diode bars and fast-axis collimating lenses.

Aspects and embodiments relate generally to the field of creating a pre-deformed fast-axis collimating lens, hereinafter referred to as a "FAC" lens, and an associated support system for use in multi-emitter diode laser systems in order to compensate for any smile which can be present in any given multi-emitter diode bar.

It will be appreciated that diode bars are intended to emit light in a singular plane in a direction normal from the front face of the diode bar, however, either due to the manufacturing process, or some other factor, these diode bars almost always include a certain amount of deflection which can cause any of the individual emitters to either deflect out of plane or emit light in a direction not being normal to the front face of the diode bar. This deflection will be referred to hereinafter as "smile." Sometimes this smile is negligible and does not have any downstream effects, while in other situations the smile is significant enough, if left uncorrected, to have substantial detrimental effect to the efficiency, power output, and stabilization of certain systems, in particular to Wavelength Beam Combining type systems, hereinafter referred to as "WBC" systems.

The present applicants have determined a methodology and structure which compensates for and eliminates much of the detriment such smile can cause in a diode bar having multiple emitters. Furthermore, the present application takes a proactive approach to actively determining the amount of smile (or sometimes called frown) in a diode bar in a WBC type system and using that information to fabricate or choose an optimized FAC lens to correct for the measured smile.

FAC lenses are used to collimate the fast axis of each of the emitters of diode bar. In some instances the support structure, hereinafter referred to as a substrate, that FAC lenses are mounted to cause a small amount of deformation. Previous efforts have been made to produce and manufacture uniform FAC lens and holder systems. These techniques include uniform curing, mounting, CTE matching of materials and so forth. However, applicants have determined that having a FAC lens system (i.e. the lens and the supporting substrate) wherein the lens can be provided with a pre-determined curvature or smile to match that of a measured diode bar, is a more practical approach.

In the laser diode systems having FAC lenses of the present invention, each emitter gets collimated appropriately through a matching pre-deformed FAC lens system such that the light is redirected closer to a desired output profile, which in some cases eliminates or substantially reduces pointing error or into a direction being normal from the front face of the emitter bar. As a result, downstream optics can be more easily adjusted to receive each emitted beam and focus the light into a common beam.

The present application does not disclose every possible embodiment, but a variety of embodiments demonstrating the principles used to compensate for inherent smile present in a diode bar.

Figure 1B:
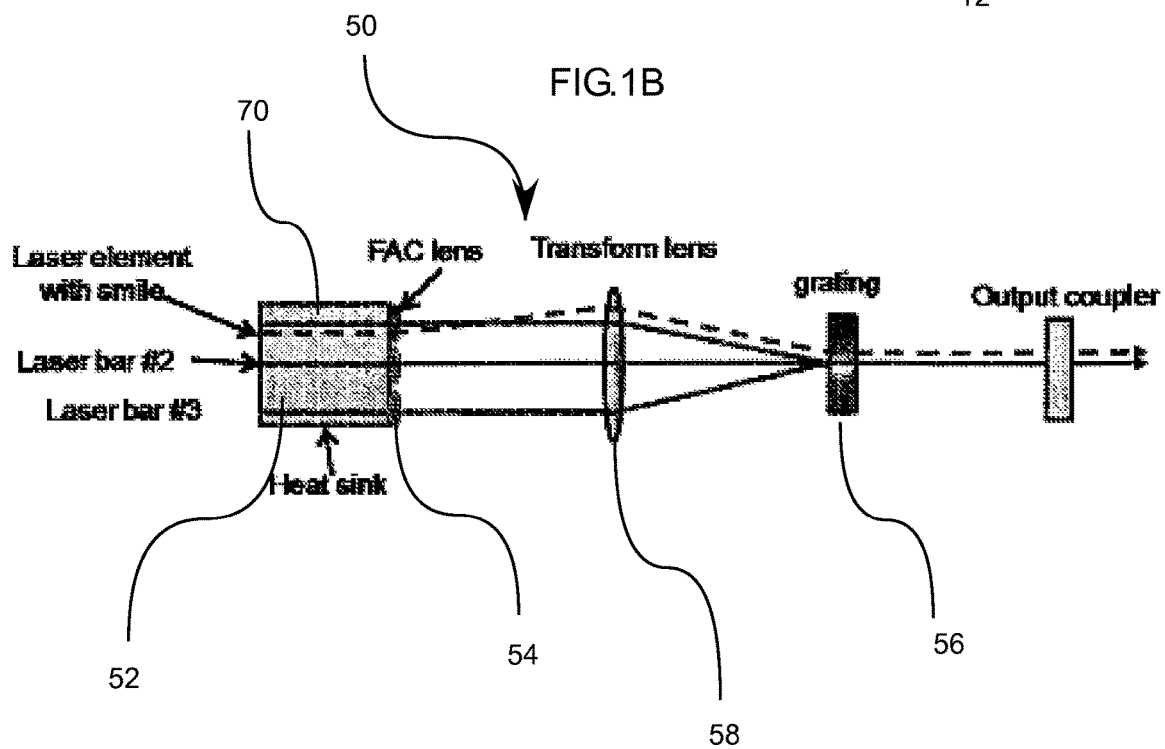

FIGS. 1A-B illustrate exemplary diode laser systems 10 and 50 each having multi-emitter diode bars 12 and 52 respectively, each multi-emitter diode bar having a plurality of emitters (not individually shown). Light leaves the multi-emitter diode bars 12 and 52 respectively and immediately passes through a respective FAC lens 14, and 54. After the FAC lens, the light can then be transmitted through alternative optical components such as beam twisters 16, gratings 56, focusing lenses, 58, slow-axis collimating lenses 18, or any other type of optical component. It will be appreciated that many other optical components and arrangements are possible after passing the light through a respective FAC lens. One goal of the present invention is to produce pre-deformed FAC lenses which correct for smile as soon as possible after the light leaves the plurality of emitters thus simplifying the functionality and cost of downstream components.

Each of the multi-emitter diode bars 12 and 52 have respective longitudinal axes or planes, 30 and 70 respectively, along which a plurality of emitters (not individually shown) can be placed. Smile occurs when any one of the plurality of emitters resides or emits light out of plane with respect to the other emitters of its respective multi-emitter diode bar. In FIG. 1A. The distance from the top, peak or highest emitter to the bottom, valley, or lowest emitter can usually be quantified in each diode bar and can vary in range. For example, those diode bars having a distance of 1 um (micrometer) or greater can cause a beam quality degradation in a system of 2 times or greater. By reducing this peak to valley distance say to 0.5 um or less can significantly reduce beam quality degradation. However, not all diode bars are assembled equally and for the same purpose, therefore, a need exists to modify a lens to match the profile to further reduce beam quality degradation in system utilizing diode bars. Maximum acceptable peak to valley distance any one emitter is in part determined by the corresponding laser system the diode bar is configured into. The offset profile referred herein includes both this peak to valley distance as well as the shape and pointing direction of each emitted beam from the plurality of the emitters formed in a diode bar. Based on the offset profile, a corresponding shape of a deformed lens can be calculated which would be able to appropriately capture the light into a desired output profile or one that is within an acceptable degree of error of a desired output profile.

FIG. 2 illustrates various multi-emitter diode bars 84A-C with corresponding FAC lenses 88A-C. This figure illustrates schematics depicting the offset profile 92A-C of each individual multi emitter diode bar 84A-C. The offset profiles 92A-C of each corresponding multi-emitter diode bar can have a dynamic shape which could require a corresponding dynamic shape to the FAC lenses 88A-C as shown. Also as shown, using a single planar lens, or rather one that doesn't correlate to the offsetting profile of the diode can actually enhance the pointing errors present in the diode bar. For example, the middle row shows a lens placed in front of the diode bar with a smile profile placed onto and the corresponding resulting profiling corning out of the lens has beams with upward angles, in plane angles and downward angles. Trying to capture this beams further downstream could be problematic.

FIGS. 3-12 illustrate various embodiments of the present invention which utilize a substrate to support a lens. In each of these embodiments the substrate has a bonding surface, to which the lens can be bonded. The bonding surface of the substrate can be flat or contoured. The contoured bonding surface can be provided having a bonding surface in the shape of a continuous waveform, i.e. having a smooth and continuous concave or convex sections, or alternatively as stepped mesa contours. It will be appreciated that the contoured bonding surface offers either continuous support to the lens, or alternatively offers a plurality of supporting points around which the lens can be deformed into the desired deformed shape, i.e. lens profile.

Figure 3A:
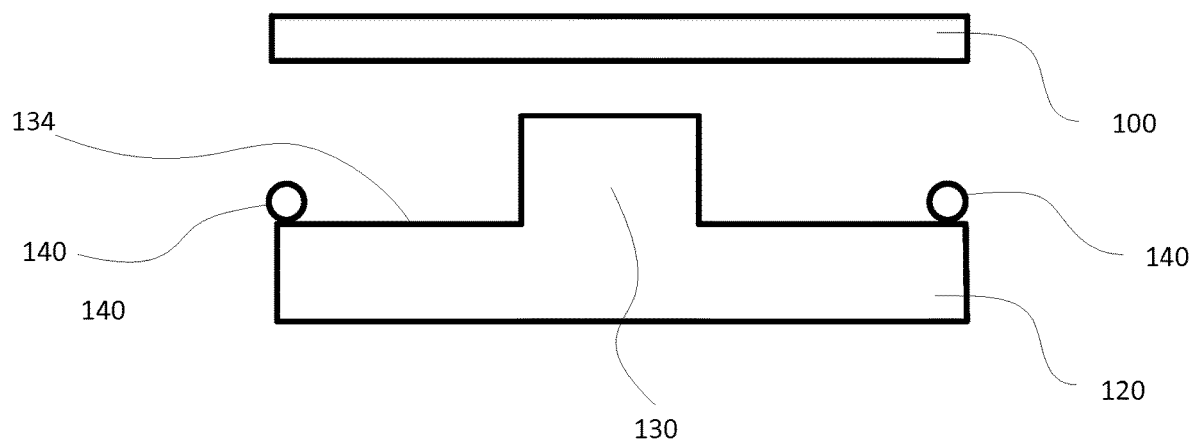
FIGS. 3A-B illustrate before and after bonding views of a planar lens onto a substrate thus forming fast-axis collimating lenses for use in laser systems as exemplified in FIGS. 1-A-B.
Figure 3B:
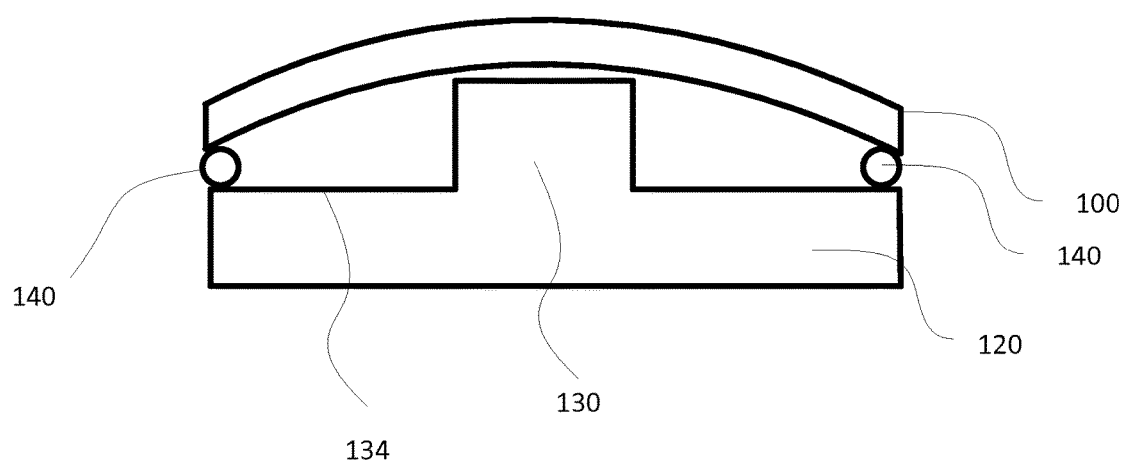

FIGS. 3A-B show depictions of a lens 100, and a substrate 120 wherein FIG. 3A is pre-bonding assembly and FIG. 3B illustrates a post-bonding assembly. It will be appreciated that in FIGS. 3A-B that only a single mesa 130 is provided as a contour to the contoured bonding surface 134 of the substrate. Then by providing two equal amounts of a common epoxy 140 on each side of the mesa 130, and allowing the epoxy to cure, the lens 100 can be deformed around the mesa 130 into an arcuate shape, i.e. a lens profile, corresponding to a shape necessary to correct for the offset profile present in a given diode bar.

It will be appreciated that the lens profile will not correspond exactly to the shape of the offset profile of the diode bar, but rather will correspond to a shape necessary to deflect light emitted by the emitters of the diode bar into a desired output profile that is reduces beam quality degradation.

Figure 4A:
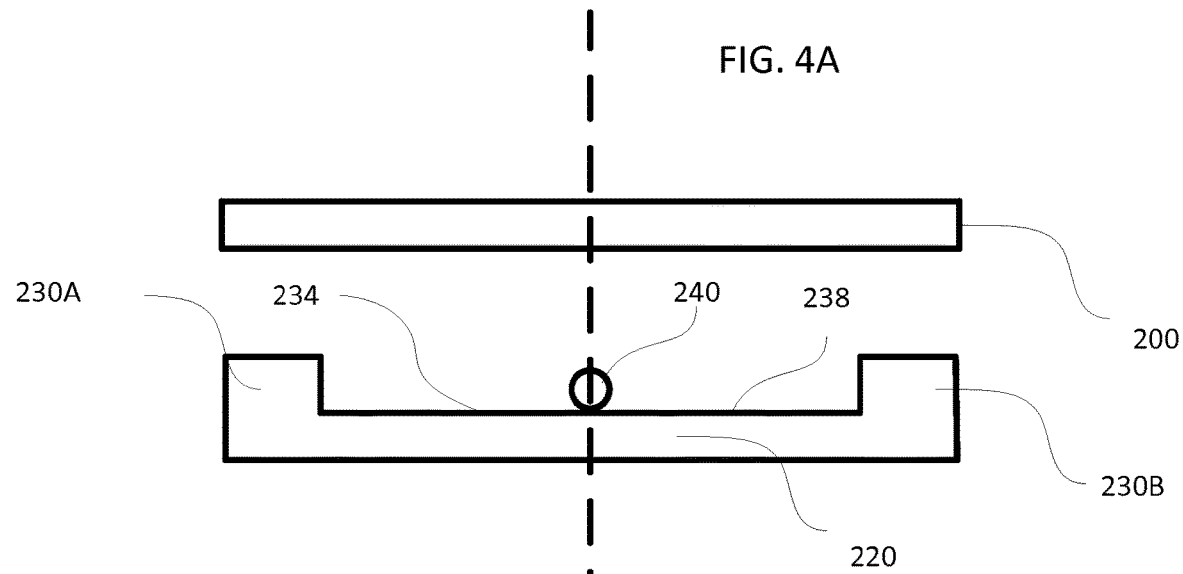
FIGS. 4A-B illustrate before and after bonding views of a planar lens onto a substrate having an alternative configuration thus forming fast-axis collimating lenses for use in laser systems as exemplified in FIGS. 1-A-B.
Figure 4B:
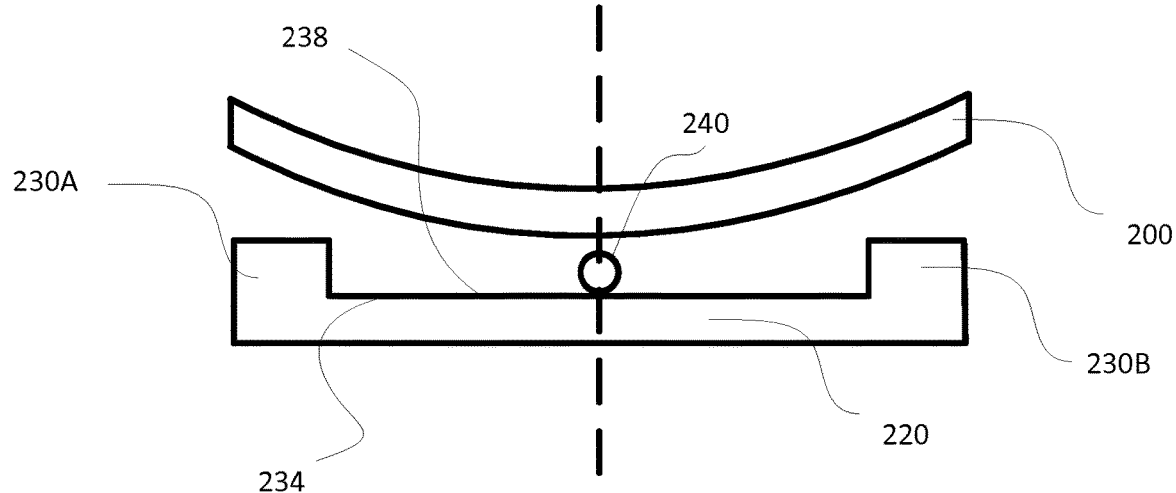

FIGS. 4A-B show depictions of a lens 200, and a substrate 220 wherein FIG. 4A is pre-bonding assembly and FIG. 4B illustrates a post-bonding assembly. It will be appreciated that in FIGS. 4A-B that a plurality of mesas 230A-B are provided as contours to the contoured bonding surface 234 of the substrate. Then by providing an amount of epoxy 240 in the valley 238 formed between the mesas 230A-B, and allowing the epoxy to cure, the lens 200 can be deformed around the mesas 230A-B into lens profile corresponding to a shape necessary to correct for another possible offset profile present in a given diode bar.

Figure 5A:
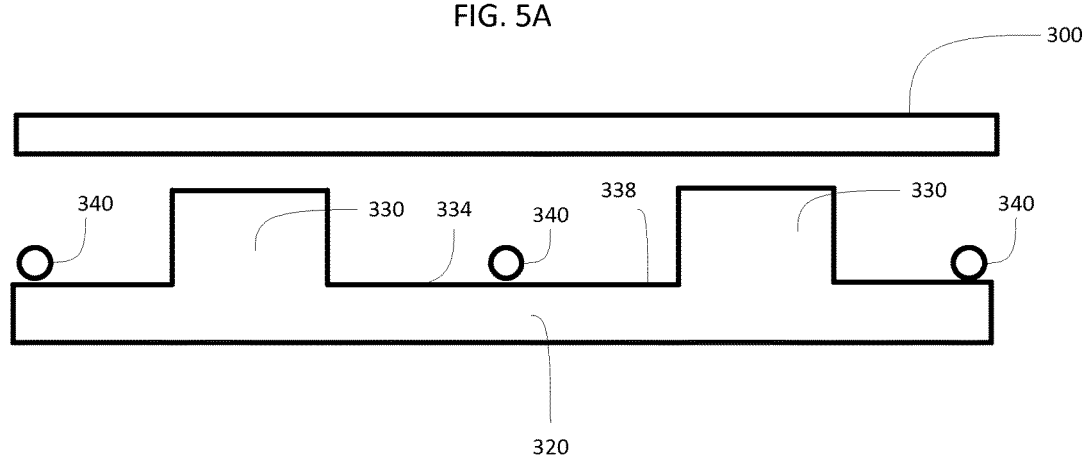
FIGS. 5A-B illustrate before and after bonding views of a planar lens onto a substrate having yet another alternative configuration thus forming fast-axis collimating lenses for use in laser systems as exemplified in FIGS. 1-A-B.
Figure 5B:
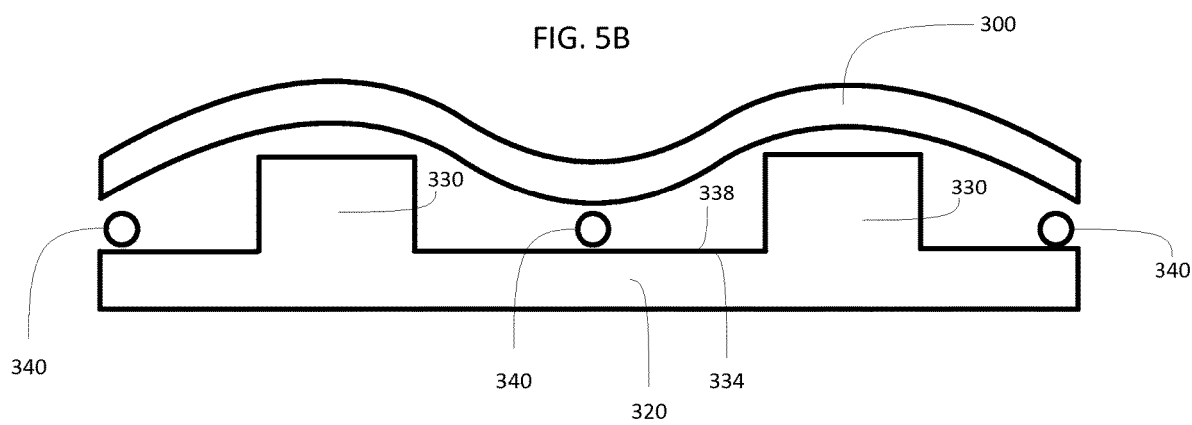
Figure 6A:
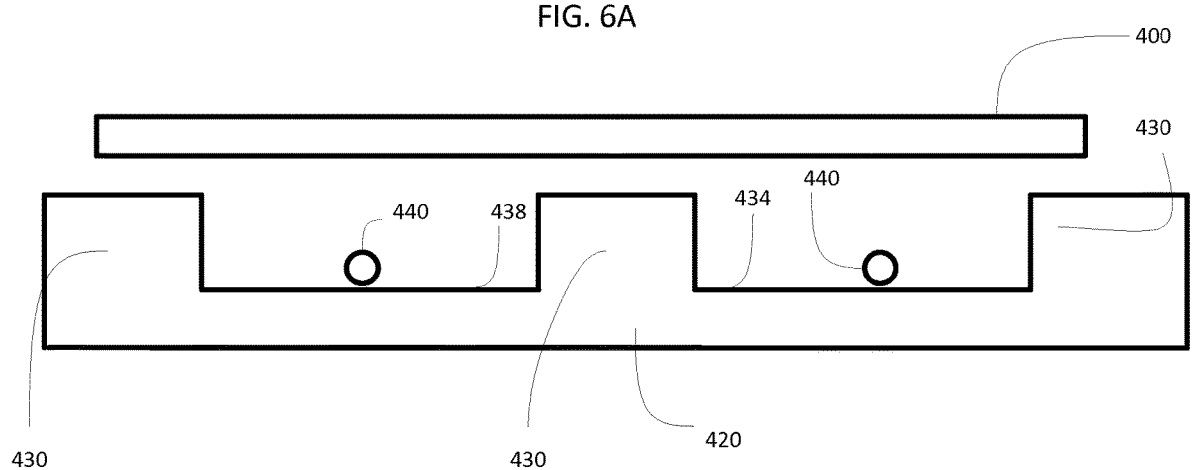
FIGS. 6A-B illustrate before and after bonding views of a planar lens onto a substrate having yet another alternative configuration thus forming fast-axis collimating lenses for use in laser systems as exemplified in FIGS. 1-A-B.
Figure 6B:
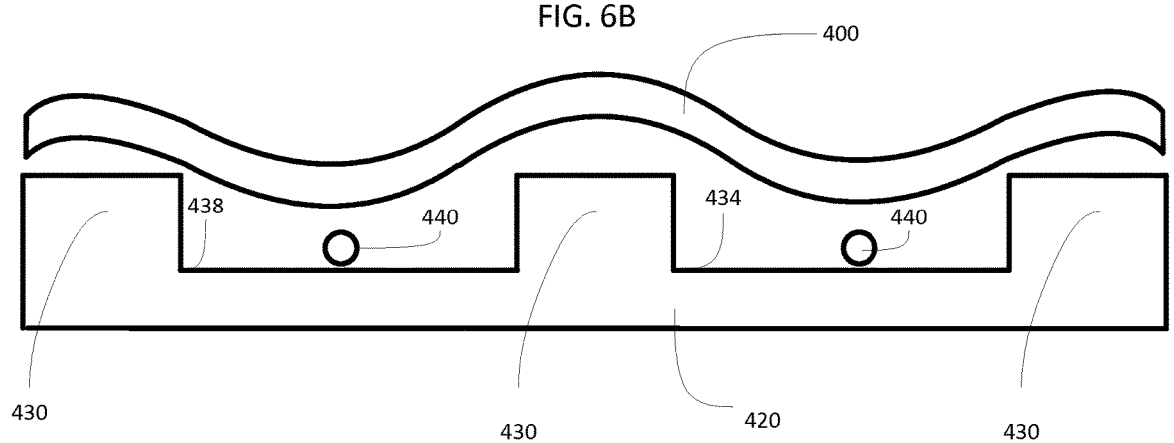

FIGS. 5A-B as well as FIGS. 6A-B show depictions of before and after bonding of lens assemblies which show how lenses 300 and 400 can be deformed so as to reflect high order lens profiles in order to match lenses to complex high order offset profiles which can exist in real world diode bars. Each of the substrates 320 and 420 can have a contoured bonding surface 334 and 434 respectively, each having numerous respective mesas 330 and 430 respectively, as well as numerous valleys 338 and 438 respectively. Then by providing an amount of epoxy 340 and 440 in the respective valleys 338 and 438 formed between the respective mesas 330 and 430, and allowing the epoxy to cure, the lenses 300 and 400 can be deformed around their respective mesas into a plurality of arcs that are shaped corresponding to a shape necessary to correct (or reduce beam quality degradation) for other possible offset profiles present in alternative given diode bars.

Figure 7A:
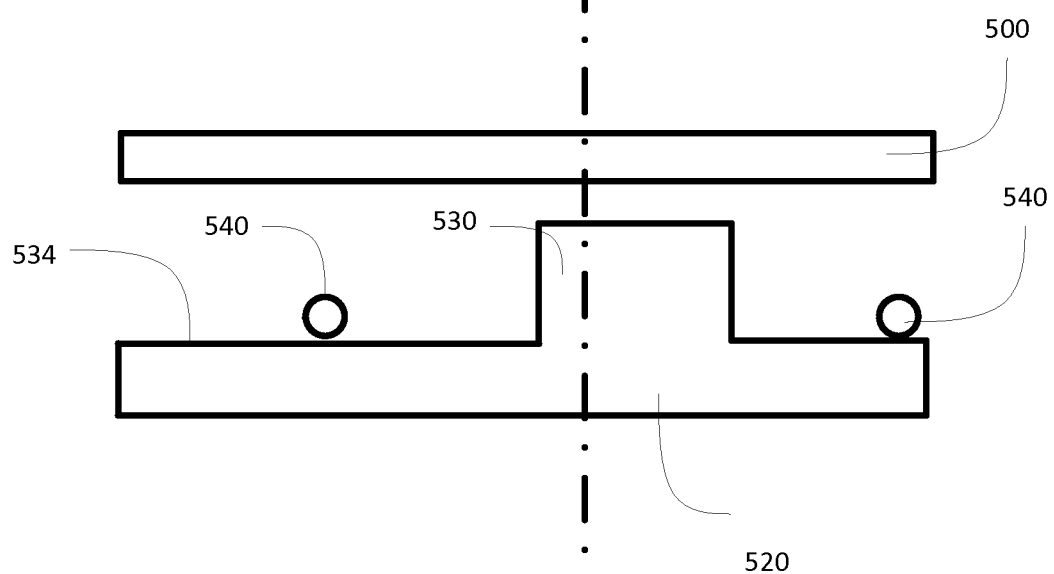
FIGS. 7A-B illustrate before and after bonding views of a planar lens onto a substrate having yet another alternative configuration thus forming fast-axis collimating lenses for use in laser systems as exemplified in FIGS. 1-A-B.
Figure 7B:
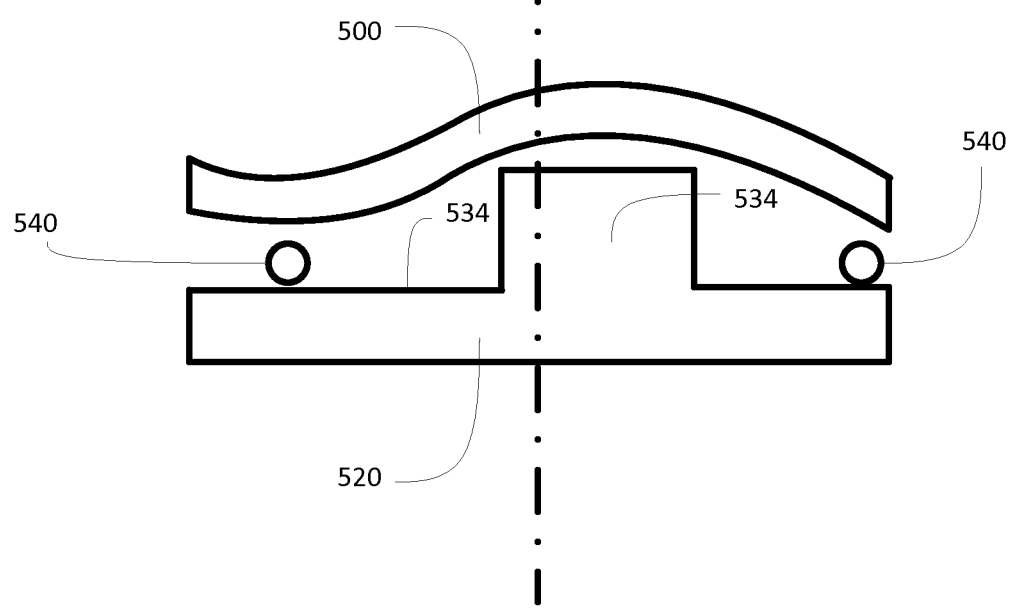

FIGS. 7A-B depict a lens 500, and a substrate 520 wherein FIG. 7A is pre-bonding assembly and FIG. 7B illustrates a post-bonding assembly. It will be appreciated that in FIGS. 7A-B that mesa 530 can be provided at varying positions along the contoured bonding surface 534 of the substrate 520. Then by providing an amount of epoxy 540 on either side of the mesa 530, and allowing the epoxy to cure, the lens 500 can be deformed around the mesas 530 virtually any shape corresponding to a required lens profile being necessary to correct (or reduce beam quality degradation) for another possible offset profile present in a given diode bar.

Figure 8A:
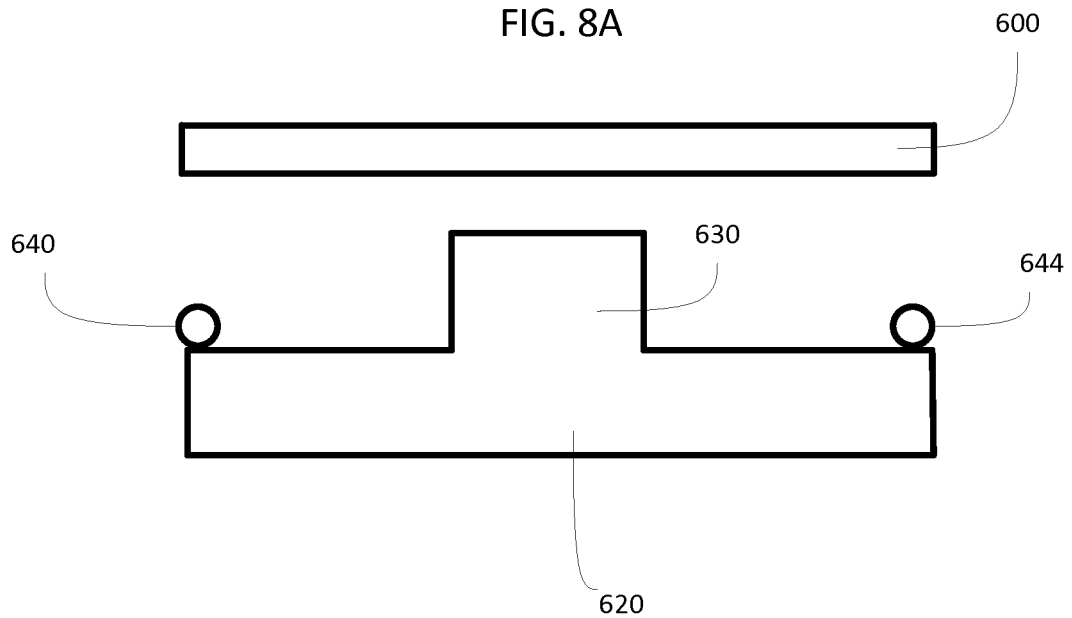
FIGS. 8A-B illustrate before and after bonding views of a planar lens onto a substrate wherein two alternative epoxies are used in order to achieve yet another alternative configuration thus forming fast-axis collimating lenses for use in laser systems as exemplified in FIGS. 1-A-B.
Figure 8B:
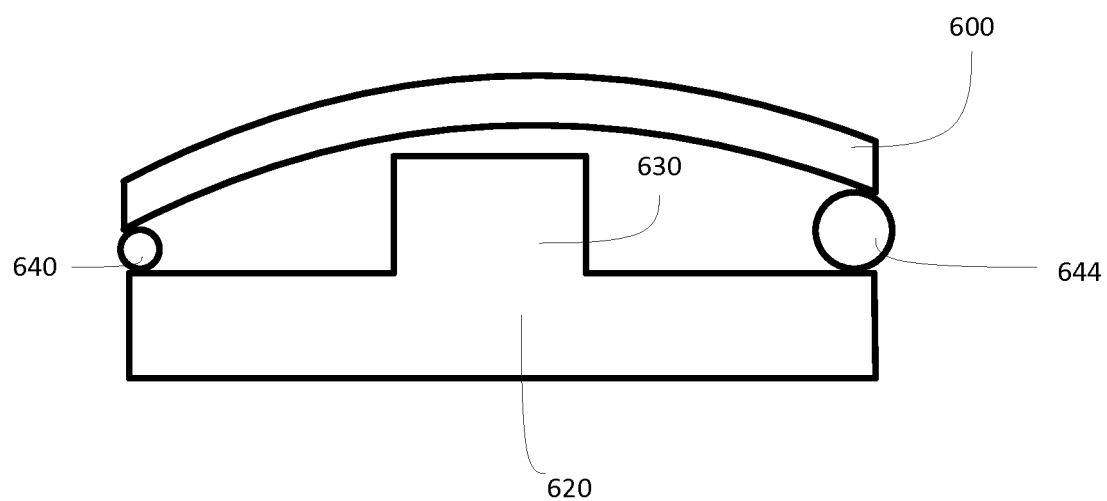

FIGS. 8A-B depict a lens 600, and a substrate 620 wherein FIG. 8A is pre-bonding assembly and FIG. 8B illustrates a post-bonding assembly. FIGS. 8A-B one scenario wherein using varying types of epoxy material 640 and 644 respectively, wherein the two epoxy materials 640 and 644 have different coefficients of retraction during the curing process. The coefficient of retraction can be described as the volumetric shrinkage or expansion that an epoxy material experiences during the curing process. It will be readily understood by those of ordinary skill in the art that some epoxies expand, some contract, and there are various degrees of each effect depending on the type of epoxy or adhesive used.

It will also be appreciated that while the present embodiments primarily discuss the use of epoxy material, that any adhesive having any expanding, neutral, or contracting properties can be used and still be within the scope of the present invention, and the epoxy is merely discussed for illustrative purposes. By providing amounts of epoxy 640 and 644 on either side of the mesa 630, and allowing the respective epoxies to cure, the lens 600 can be deformed around the mesas 630 to deflect more on one side and less on the other. In this manner virtually any shape with any arc radius corresponding to virtually any required lens profile can be created so as to correct (or reduce beam quality degradation) for virtually any another possible offset profile present in a given diode bar. It will be further appreciated that it is also possible to use various adhesive materials in any of the substrate configurations of any of the other figures discussed herein so as to achieve any desired lens profile.

Figure 9A:
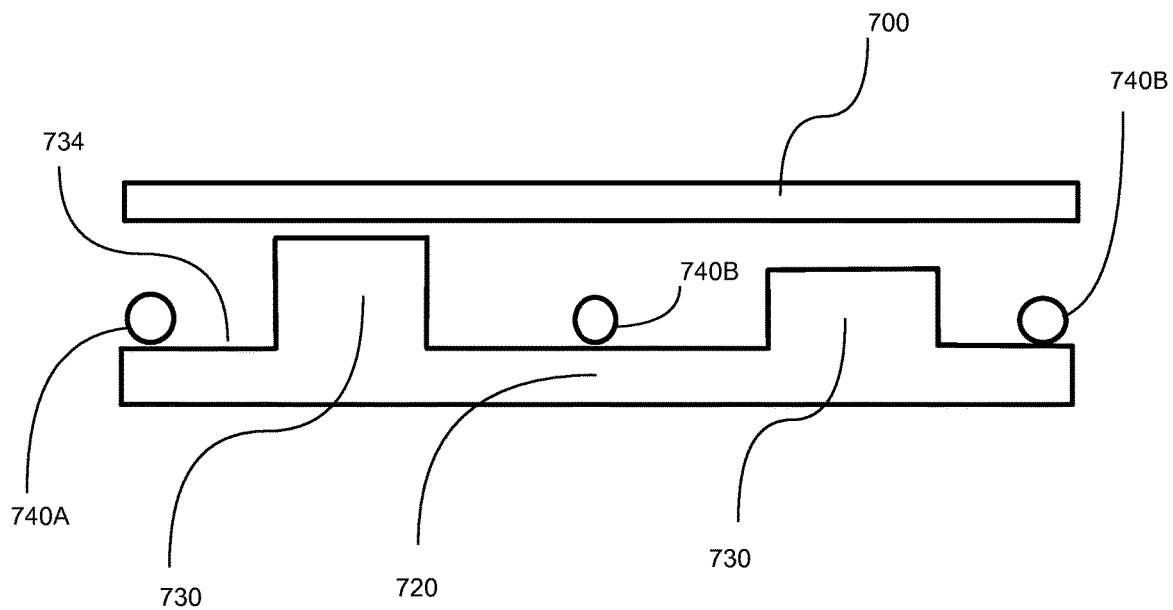
FIGS. 9A-B illustrate before and after bonding views of a planar lens onto a substrate wherein different contour configurations are used in order to achieve yet another alternative configuration of a fast-axis collimating lenses for use in laser systems as exemplified in FIGS. 1-A-B.
Figure 9B:
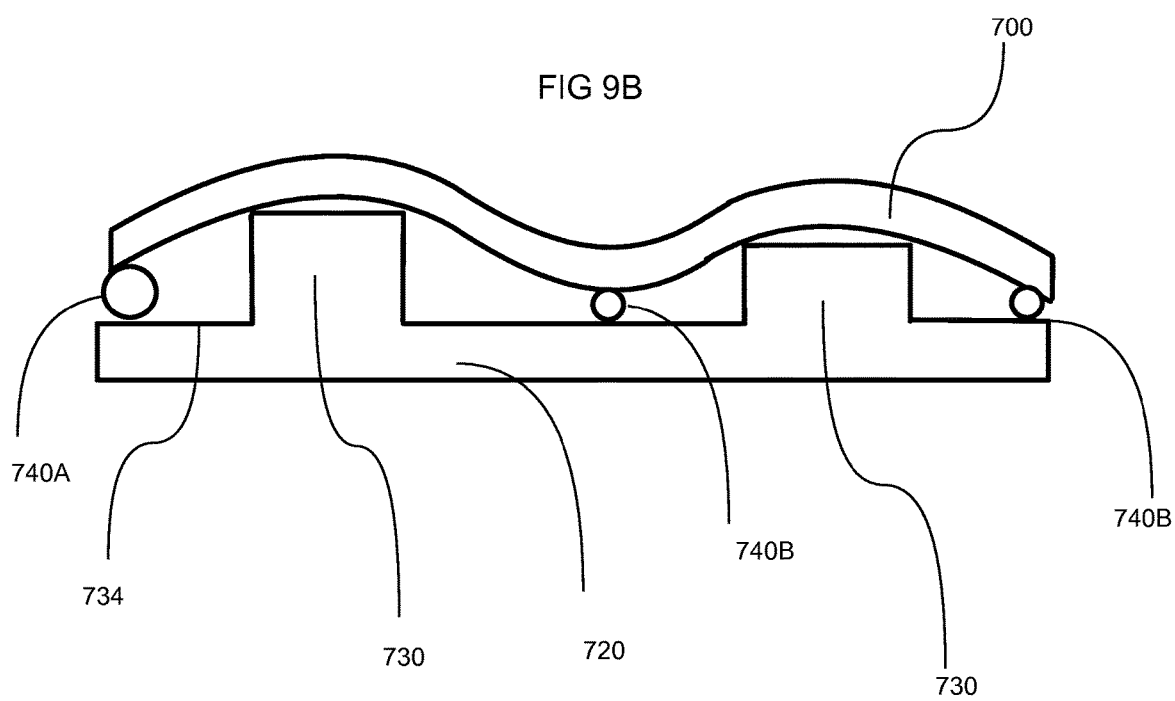

FIGS. 9A-B show depictions of a lens 700, and a substrate 720 wherein FIG. 9A is pre-bonding assembly and FIG. 9B illustrates a post-bonding assembly. It will be appreciated that in FIGS. 9A-B that a plurality of mesas 730A-B are provided as contours to the contoured bonding surface 734 of the substrate 720. It will be appreciated that mesas 730A and 730B are provided having different heights and widths. These figures depict how the mesas 730A and 730B can be provided in plurality in any combination of varying heights and thicknesses so as to achieve a proper support profile for any given lens profile. Then by providing an amount of adhesive materials 740A-B onto the bonding surface 734 and allowing the epoxy to cure, the lens 700 can be deformed around the mesas 730A-B into lens profile corresponding to a shape necessary to correct for another possible offset profile present in a given diode bar.

Figure 10A:
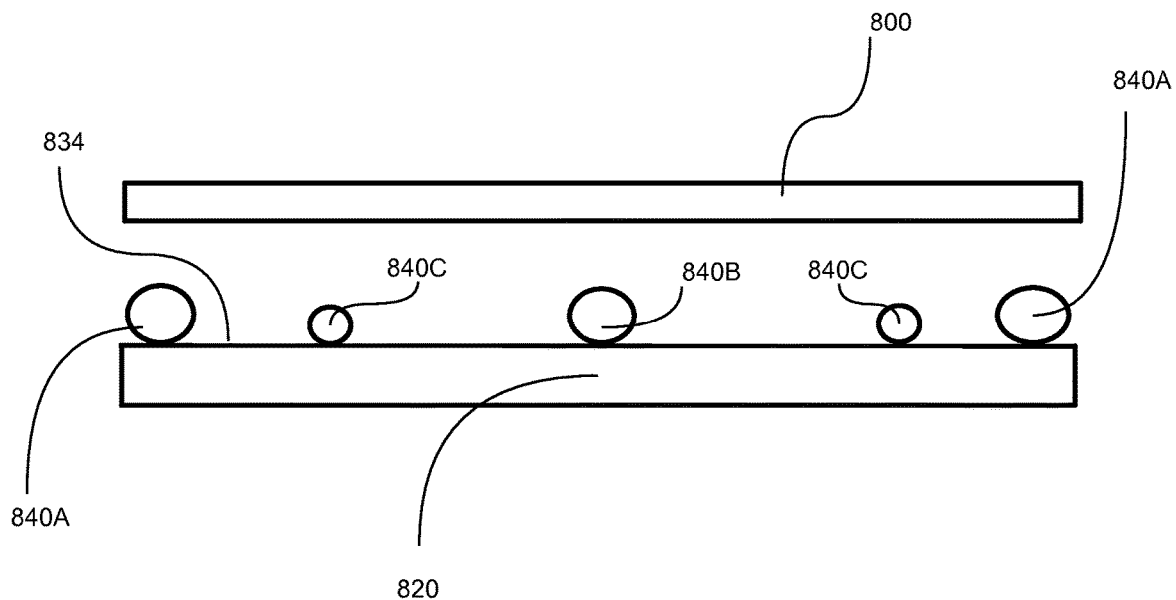
FIGS. 10A-B illustrate before and after bonding views of a planar lens onto a substrate wherein different contour configurations are achieved in the lens by using various adhesive materials on a planar surface of a substrate, each of the adhesive materials having varying coefficients of retraction, the contour configurations being capable of use in laser systems as exemplified in FIGS. 1-A-B.
Figure 10B:
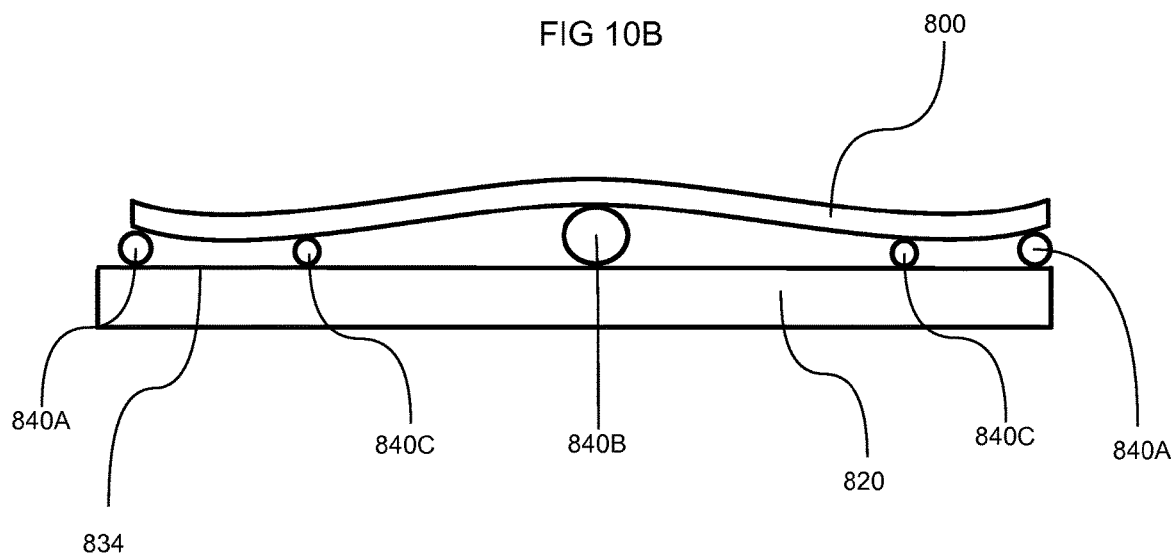

FIGS. 10A-B illustrate depictions of a lens 800, and a substrate 820 wherein FIG. 10A is pre-bonding assembly and FIG. 10B illustrates a post-bonding assembly. It will be appreciated that in FIGS. 10A-B that the substrate 820 is provided having a flat or planar bonding surface 834, instead of machining the bonding surface into a desired complex shape. Instead, a contoured support structure can be achieved by providing various adhesive materials 840A-C, each adhesive material having a unique coefficient of retraction during the curing process. These figures illustrate how one could apply known amounts of different adhesive materials with known coefficients of retraction, that during the curing process certain regions of the planar lens 800 can be pulled toward the substrate 820 in varying degrees, thus resulting in a deformed lens in a desired shape at the end of the curing process.

Figure 11A:
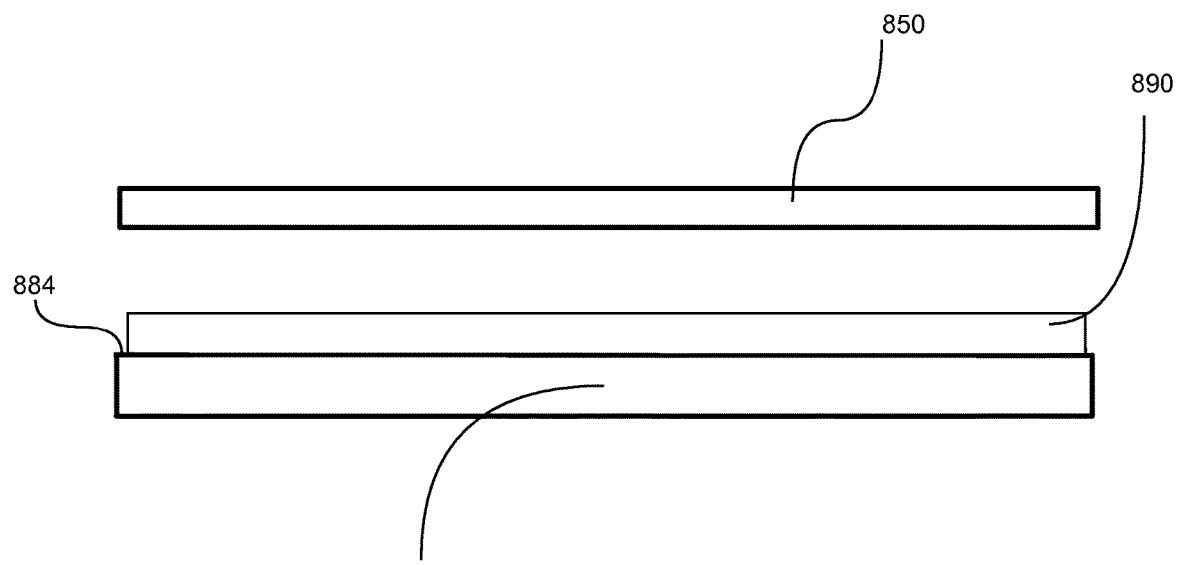
FIGS. 11A-B illustrate before and after bonding views of a planar lens onto a substrate wherein different contour configurations are achieved in the lens by using a singular adhesive material on a planar surface of a substrate, wherein the adhesive material is subjected to a curing accelerant having a varying intensity across the surface of the substrate and the lens, the varying contour configurations being capable of use in laser systems as exemplified in FIGS. 1-A-B.
Figure 11B:
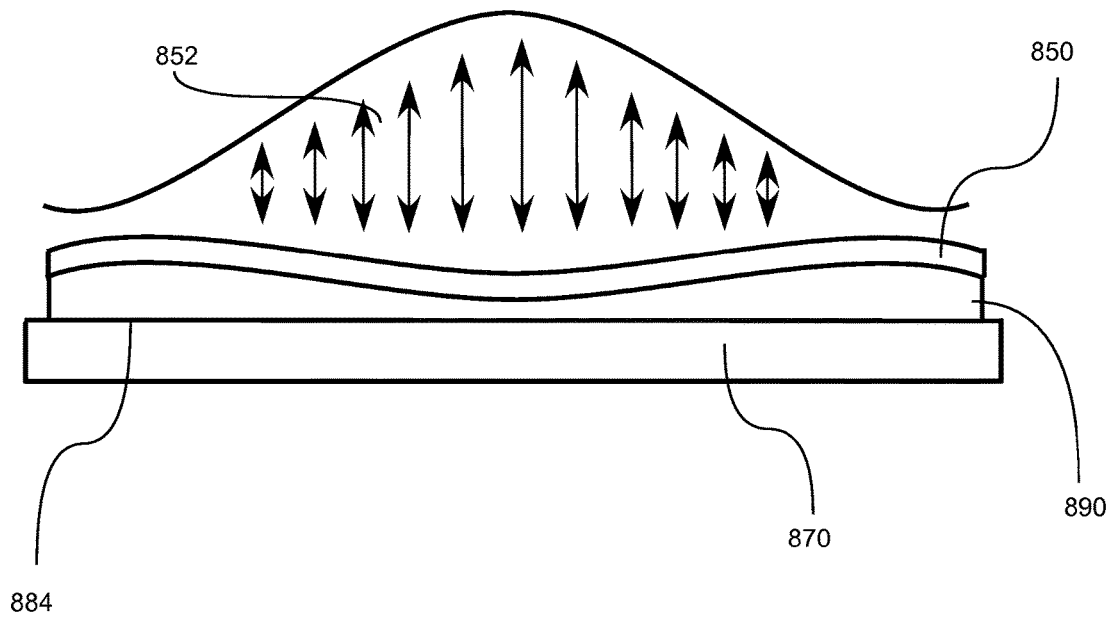

FIGS. 11A-B illustrate depictions of a lens 850, and a substrate 8700 wherein FIG. 11A is pre-bonding assembly and FIG. 11B illustrates a post-bonding assembly. It will be appreciated that in FIGS. 11A-B that the substrate 870 is provided having a flat or planar bonding surface 884, instead of machining the bonding surface into a desired shape. Instead, a contoured support structure can be achieved by providing a uniform amount of adhesive material 890, to the planar bonding surface 884. Then rather than allowing the adhesive material 890 to cure uniformly and provide a uniform retraction force, which would result in zero or little lens deflection, a curing accelerant 852 can be applied to the adhesive in varying intensities across the bonding surface. Such an accelerant can include, but is not limited to, heat, curing lights, pressure, etc. In this manner, because the areas that are subjected to high intensities of curing accelerant will cure quicker and set their respective positions, the slowing curing areas will deform slightly to adjust to the variation as they cure more slowly. Thus the end result can be a contoured adhesive layer as shown by 890 in FIG. 11B as well as a corresponding deformed lens 850. This non-uniform curing methodology can be used to create a variety of correlating profile shapes in a FAC lens used to reduce beam quality degradation in the system.

Figure 12A:
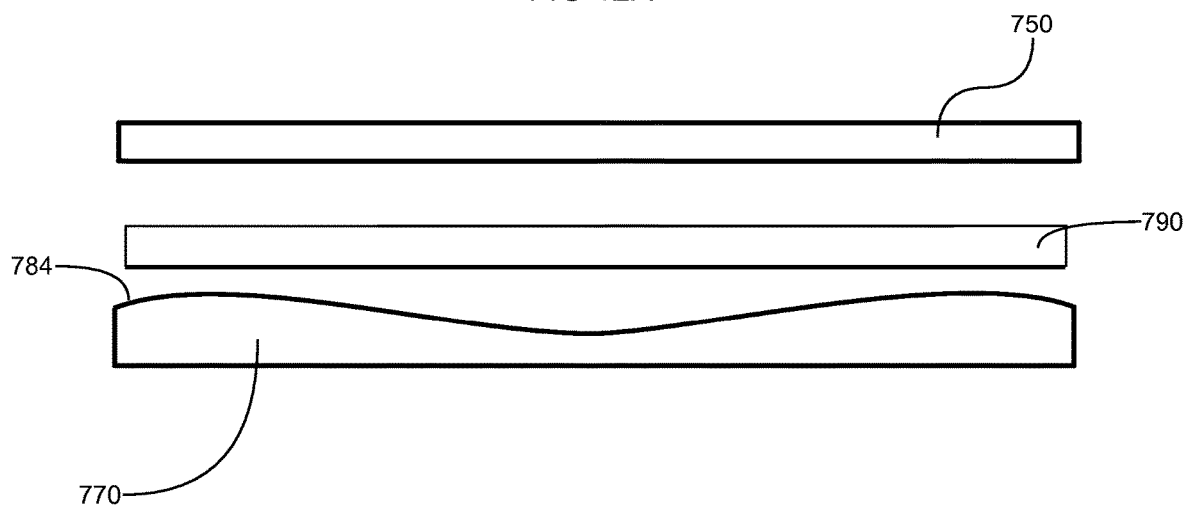
FIGS. 12A-B illustrate before and after bonding views of a planar lens onto a contoured substrate in the shape of a continuous waveform, the contoured substrate being capable of use in laser systems as exemplified in FIGS. 1-A-B.
Figure 12B:
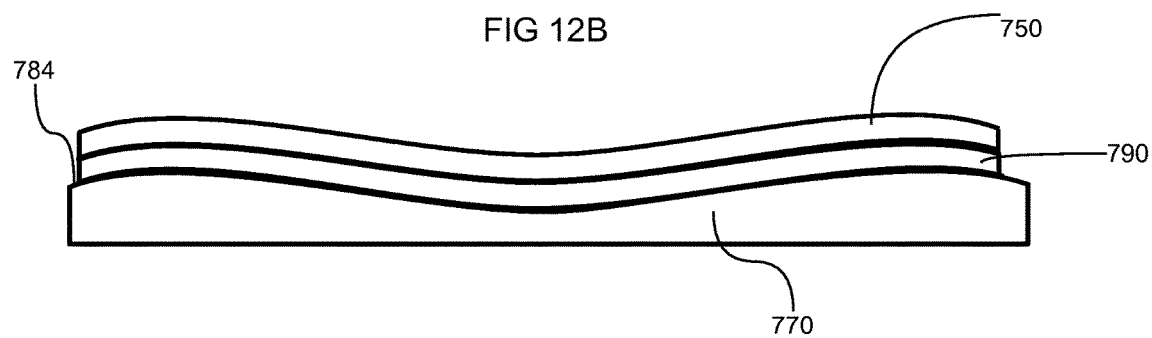

FIGS. 12A-B illustrate depictions of a lens 750, and a substrate 770 wherein FIG. 12A is pre-bonding assembly and FIG. 12B illustrates a post-bonding assembly. It will be appreciated that in FIGS. 12A-B that the substrate 770 is provided having a contoured bonding surface 834 in the shape of a continuous waveform. In this embodiment a singular adhesive material 790 can be provided either continuously, as shown, or intermittently across the bonding surface. Then the adhesive material can be allowed to cure and thus pull and deform the lens 750 into the contoured or deformed shape corresponding to the shape of the bonding surface 784 of the substrate 770. It will be appreciated that any of the variants discussed above with respect to contours as well as varying of the adhesive materials can be used in conjunction with a partial continuous waveform shape, or in any other suitable combination with the above teachings so as to achieve a desired deformation to the lens.

It will be appreciated that each of the substrates are adhered to FAC lenses in order to provide a mounting surface used in the alignment process of a FAC Lens system having an array of FAC lenses to a diode bar having a similar array of emitters. These can be one or two-dimensional arrays. The holders can also be used to permanently fix the FAC lens system into place.

As discussed above, various adhesive materials, each having a unique and distinct shrinkage property and strength, can also be used in conjunction with mesas of varying height and width such that during the curing process non-uniform stresses occur across the bonding surface and cause bending or smile to occur in the lens. Varying the amount of epoxy used, the area of coverage, and the type of epoxy used determine the deformation of the FAC lens system. It is contemplated herein that at least epoxies including optocast 3411 and NOA 61 can be utilized wherein these two epoxies have different coefficients of retraction and by varying the amount and using each of them alternatively at the various adhesion points in conjunction with the mesas, that virtually any desired shape can be achieved.

One advantage of using mesas on the bonding surfaces of the substrates, rather than a continuous waveforms, is that mesas can offer sufficient support and provide necessary for holding the lenses in the desired deformed lens profiles but are much easier to machine and thereby less costly to manufacture than substrates having continuous waveform shapes.

The mesas of the above discussed embodiments can have a height between 0-100 um (and variable in length) though not limited to this range of heights and length only. Another way of describing the way a lens deforms around the mesas is that each of the mesa corners can be used as a fulcrum or pivot point about which the lens may be deformed. Adhesive can placed on either side of, or even onto the mesa surfaces, wherein the adhesive pulls the lens downward thus causing the lens to deform accordingly.

FIG. 13 illustrates a method of optimizing the output of a multi-emitter diode bar within a light emitting diode laser system 900 which is also contemplated by this invention. The method can include steps as laid forth below. First, by measuring an offset profile of each of a plurality of diode emitters within a multi-emitter diode bar 904 one can then determine a correlating lens profile which would direct any light emitted from each of the plurality of diode emitters into a desired output profile 908. In order to form a lens having a lens profile as discussed above, first one must provide a planar lens 912, as well as a substrate 916 to which the lens can be bonded. Then an adhering step 920 can be performed in which the planar lens is adhered to an adhesion surface of the substrate in a manner that causes the planar lens to deform to match the correlating lens profile. Desired output profiles may include causing all the emitters to emit parallel to each other, to emit in a non-parallel manner, to emit in a particular pattern or pointing direction and so forth.

As discussed briefly above, any adhesive can theoretically be used, however, certain advantages have been realized by and through the use of an epoxy material 936. Also discussed above, but not explicitly disclosed, are further method steps including: providing a plurality of epoxy materials each having a different coefficient of contraction during the curing process 940; placing an amount of at least two different epoxy materials each having a different coefficient of contraction between the substrate and the planar lens 944; and curing the amount of the at least two different epoxy materials such that the planar lens is adhered to and pulled toward the substrate by the contracting epoxies during curing so as to deform the lens into the correlating lens profile 948.

Also contemplated by the method are steps regarding the providing a variable or contoured adhesion surface to the substrate 924 in order to help maintain the shape of the lens in the desired lens profile, such steps can include the steps as laid forth below. For example one or more mesas can be provided on the adhesion surface of the substrate, the one or more mesas providing support to the lens in order to maintain the lens' shape in the correlating lens profile 928. It should be noted that each of the mesas can vary in height or width from other mesas formed on the bonding surface of the substrate 932.

FIG. 14 illustrates yet another method which is contemplated by the present invention. This method contemplates the optimization of the output of a multi-emitter diode bar within a light emitting diode laser system 950 by following a series of steps as laid out below. This method includes: fabricating a plurality of multi-emitter diode bars, each multi-emitter diode bar having a plurality of diode emitters 952; measuring an offset profile of each of the plurality of diode emitters within each multi-emitter diode bar 954; and determining a set of profile markers for each multi-emitter diode bar 956. Once all of the multi-emitter diode bars are measured and offset profiles and associated markers are determined for each one, the multi-emitter diode bars can be sorted, each going into a plurality of diode bar bins 958. Each diode bar bin can be correlated to receive multi-emitter diode bars having profile markers within a common similarity threshold, i.e. wherein each of the profile markers are within a certain distance from a set value.

Simultaneously a plurality of lenses can be provided 960, each lens having a lens profile. The lens profile can be paired and similarly sorted based on a set of pairing markers that describe the profile of each lens within a lens similarity threshold. The lenses can then be sorted or matched 962 into bins or categories which correspond to lens profiles which would properly correct for the offset profiles of a matched diode bar bins such that any one of the lenses in a matched bin would correct the light emitted from any one of the diode bars contained within a particular diode bar bin into a common plane threshold. In other words each lens from the plurality of lenses in a matched lens bin, each lens bin corresponding to a paired diode bar bin, wherein each matched lens within the bin has a lens profile designed to redirect light emitted from diode bars having offset profiles of each corresponding bin into a common plane threshold.

Similarly, this method can also include alternative variations and additional lens forming steps including: providing a substrate 964; adhering a planar lens to a substrate using an adhesive material 972. The method therefore can further include: providing a plurality of adhesive materials each having a different coefficient of contraction during the curing process 974; placing an amount of at least two different adhesive materials each having a different coefficient of contraction between the substrate and a planar lens 976; and curing the amount of the at least two different adhesive materials such that the planar lens is adhered to and pulled toward the substrate by the contracting epoxies during curing so as to deform the lens into the correlating lens profile 978. Some of these steps are discussed above, and can be performed in any suitable order and in any suitable combination. It will also be noted that the adhesive material can be provided as a glue, epoxy, or any other suitable adhesive material.

Further, steps can be provided which allow for the providing a contoured adhesion surface on a substrate for each lens 966. Such contouring can include the provision one or more mesas to the contoured adhesion surface on the substrate for each lens 968, the one or more mesas providing support to the lens in order to maintain the lens' shape in a correlating lens profile.

The method can include an adhering step wherein the each lens is formed by adhered each lens to a corresponding substrate using an epoxy or other adhesive material.

Further, as discussed above a plurality of mesas can be provided wherein the mesas can vary in either height or width, or both, from at least one other mesa 970.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

We claim:

1. A laser system comprising:
   a multi-emitter diode bar comprising an array of diode emitters each configured to emit a discrete beam, wherein (i) at least two of the diode emitters are offset from each other and (ii) an output profile of the diode bar includes light emitted in a direction not perpendicular to a front face of the diode bar and/or light not emitted in a single plane emerging from the front face of the diode bar;
   disposed optically downstream of the diode bar, a transform lens for receiving the emitted beams and focusing the beams toward a grating;
   disposed optically downstream of the transform lens, a grating for receiving the focused beams and combining the focused beams into a single combined beam;
   disposed optically downstream of the grating, an output coupler for receiving the combined beam and outputting an output beam; and
   associated with the diode bar and disposed optically downstream of the diode bar and optically upstream of the transform lens, a collimating lens that is (i) configured to receive the beams emitted from the diode bar and (ii) shaped so as to direct the beams, through an optical axis of the collimating lens, into a desired output profile different from the output profile, whereby beam quality degradation associated with the output profile is reduced.

2. The laser system of claim 1, wherein the collimating lens is a fast-axis collimating lens configured to collimate the beams along fast axes thereof.

3. The laser system of claim 2, further comprising, disposed optically downstream of the collimating lens, a slow-axis collimating lens configured to collimate the beams along slow axes thereof.

4. The laser system of claim 1, further comprising an optical twister disposed optically downstream of the collimating lens.

5. The laser system of claim 1, further comprising a heat sink coupled to the diode bar.

6. The laser system of claim 1, wherein the shaped collimating lens is permanently associated with the diode bar.

7. The laser system of claim 1, wherein the collimating lens is not adhered to the diode bar.

8. The laser system of claim 1, further comprising a substrate configured to maintain the shape of the collimating lens.

9. The laser system of claim 8, wherein the substrate permanently fixes the lens such that the beams are transmitted through the optical axis of the collimating lens into the desired output profile.

10. The laser system of claim 8, wherein:
    the collimating lens has a bottom surface having a surface normal that is perpendicular to the optical axis of the collimating lens; and
    the bottom surface of the collimating lens is coupled to a bonding surface of the substrate configured to maintain the shape of the collimating lens.

11. The laser system of claim 10, wherein the bonding surface of the substrate underlies an entirety of the collimating lens.

12. The laser system of claim 10, further comprising one or more adhesive materials adhering at least a portion of the bottom surface of the collimating lens to the bonding surface of the substrate.

13. The laser system of claim 12, wherein the one or more adhesive materials comprises a plurality of different adhesive materials.

14. The laser system of claim 13, wherein at least one adhesive material has a different coefficient of retraction than that of at least one other adhesive material.

15. The laser system of claim 12, wherein the collimating lens is adhered to the bonding surface of the substrate only at one or more discrete points, the collimating lens not being adhered to an entirety of the bonding surface.

16. The laser system of claim 10, wherein the bonding surface defines one or more mesas protruding above the substrate toward the collimating lens, the one or more mesas providing support to the collimating lens in order to maintain a shape of the collimating lens.

17. The laser system of claim 16, wherein (i) the one or more mesas comprises a plurality of mesas protruding above the substrate toward the collimating lens, and (ii) at least one of a height or width of one of the mesas is different from that of at least one other mesa.

18. The laser system of claim 10, wherein at least a portion of the bonding surface has a shape of a continuous waveform.

19. The laser system of claim 10, wherein the substrate comprises glass.

20. The laser system of claim 19, wherein a coefficient of thermal expansion of the substrate matches a coefficient of thermal expansion of the collimating lens.

* * * * *